(12) United States Patent
Chen

(10) Patent No.: US 6,916,730 B2
(45) Date of Patent: Jul. 12, 2005

(54) METHOD FOR FORMING A GATE

(75) Inventor: Wei-Wen Chen, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/368,469

(22) Filed: Feb. 20, 2003

(65) Prior Publication Data

US 2003/0148571 A1 Aug. 7, 2003

Related U.S. Application Data

(62) Division of application No. 09/803,986, filed on Mar. 13, 2001, now abandoned.

(51) Int. Cl.[7] .......................................... H01L 21/3205
(52) U.S. Cl. ..................... 438/585; 438/591; 438/287; 438/792
(58) Field of Search ................................ 438/197, 216, 438/287, 301, 585, 591, 792

(56) References Cited

U.S. PATENT DOCUMENTS

| | | |
|---|---|---|
| 6,184,110 B1 | 2/2001 | Ono et al. |
| 6,200,651 B1 | 3/2001 | Roche et al. |
| 6,432,780 B2 | 8/2002 | Chen |
| 2002/0098710 A1 | 7/2002 | Sandhu et al. |

*Primary Examiner*—Jack Chen

(57) ABSTRACT

First of all, a semiconductor substrate is provided. Then a gate oxide layer having an uniform thickness is formed on the semiconductor substrate by way of using thermal oxidation. Subsequently, a doping layer is formed on the gate oxide layer by a plasma doped process. Next, forming a poly-layer on the doping layer of the gate oxide layer, wherein the poly-layer has an ions-distribution. Afterward, defining the poly-layer to form a poly-gate. The P-type ions are then implanted into the poly-gate and the substrate by way of using a self-aligned process. Finally, performing a thermal annealing process to form a uniform ion-implanting region and a poly-gate having a lower contact-resistance.

11 Claims, 7 Drawing Sheets

METHOD FOR FORMING A GATE

This application is a Division of application Ser. No. 09/803,986 filed Mar. 13, 2001 now abandoned.

BACKGROUND OF THE INVENTION

1. Field of the Invention

The present invention relates generally to a method for forming a metal-oxide-semiconductor device, and more particularly to a method for avoiding the ion penetration with the plasma doping.

2. Description of the Prior Art

As semiconductor devices, such as Metal-Oxide-Semiconductor (MOS) devices, become highly integrated, the area occupied of the chip has to be maintained or more less, so as to reduce the unit cost of the circuit. For corresponding with the development of the high technology industry in the future, there is only one method to achieve this objective, that is, the area occupied by the devices shrinks, as well as the design rule. With advances in the semiconductor technology, the dimensions of the integrated circuit (IC) devices have been shrunk to the deep sub-micron range. As the semiconductor device continuously shrinks to deep submicron region, some problems are incurred due to the process of scaling down.

Metal-oxide-semiconductor (MOS) devices have been well known in the prior art. In particular, Field-effect transistors (FETs) and other related insulated-gate electronic devices are mainstay components of metal-oxide-semiconductor integrated circuits. A MOSFET generally consists of two closely spaced, doped regions in a substrate; namely, the source region and the drain region. The region between the two doped regions is the channel above which a thin insulation layer such as a gate oxide layer is formed. A gate conductor is formed from a gate material directly over the insulation layer directly above the channel and a voltage applied to the gate conductor affects the electronic properties of the channel region, whereby the MOSFET can control current flow between the source region and the drain region (e.g., is turned on and off).

As is generally well-known in the art of CMOS technology, a CMOS (complementary metal-oxide-semiconductor) device is formed of an N-channel MOS device and a P-channel MOS device, wherein the PMOS devices are formed by implanting the substrate with a p-type dopant to form heavily doped p$^+$ source and drain regions using a self-aligned process, and the NMOS devices are formed by implanting the substrate with a n-type dopant to form heavily doped n$^-$ source and drain regions using a self-aligned process. Since the gate conductor is used in the self-aligned process, it is also implanted with a p-type/n-type dopant, for example of p-type dopant ions include B$^+$ and BF$_2^+$. Among B$^+$ and BF$_2^+$, BF$_2^+$ is preferred because of its larger atomic mass.

Furthermore, in order to increase the speed of the CMOS devices, there has existed in the micro-electronics industry over the last two decades an aggressive scaling-down of the channel length dimensions. However, as the channel length reduction occurs, the thickness of the gate oxide has to be likewise reduced down so as to avoid short channel effects. Thus, there has been proposed heretofore of using a p+-type polycrystalline silicon (poly-Si) gate so as to provide a surface channel feature in P-channel MOS devices in advanced CMOS structures. This is due to the fact that it is known that surface-channel P-channel MOS devices with p+-type poly-Si gates can improve short-channel and sub-threshold I–V characteristics and produce better controllability of the threshold voltage.

FIGS. 1A to 1C are cross-sectional views showing the progression of manufacturing steps in the formation of the metal-oxide-semiconductor according a conventional method. First of all, a substrate 100 is provided, and a shallow trench isolation 110 is formed in the substrate 100. Then, a gate oxide layer 120 having an uniform thickness is formed on the substrate 100 by way of a thermal oxidation process. Thereafter, a poly gate 130A is formed and defined on the gate oxide layer 120. Next, proceeding a self-aligned implanting process 140 with boron ions into the poly gate 130A and substrate 100. Afterward, a uniform ion-implanting region 150 and a poly gate 130B having a lower contact resistance are formed by way of using a thermal anneal process.

Typically, BF$_2^+$ ions are implanted simultaneously with the forming of the p+ poly-Si gate and a p+ shallow junction. In particular, when fluorine is present in a gate conductor along with boron, fluorine enhances boron penetration through the gate oxide and into the channel region during thermal anneals. Boron ions which have penetrated into the silicon substrate may cause a shift in the threshold voltage (V$_{th}$) of the operating device. This is because boron diffusion into the channel region results in a change in the concentration level of the n-channel substrate thereby causing a shift in threshold voltage and degrading the reliability of the devices oxide quality. Accordingly, the problem of boron penetration through the thin gate oxide due to scaling-down has become one of the major concerns for advanced CMOS technology. There are known in the art of various techniques which have been used for suppressing boron penetration. One such method is the use of nitrogen implantation into the p+ poly-Si gate. Another known method in the prior art is utilizing of an amorphous silicon gate. Also, still another known method involves the use of a stacked amorphous silicon/poly-Si gate. However, all of these aforementioned approaches suffer from the disadvantage of increasing the complexity of the conventional CMOS fabrication process. This is because of the different deposition process required for the poly as well as different etching processes needed to remove the poly. In view of the foregoing, there still exists a method for fabricating advanced CMOS integrated circuits so as to prevent ions penetration through the thin gate oxide of devices, which require only minimal modification to the conventional MOS fabrication process.

In accordance with the above description, a new and improved method for forming the metal-oxide-semiconductor is therefore necessary, so as to raise the yield and quality of the follow-up process.

SUMMARY OF THE INVENTION

In accordance with the present invention, a method is provided for fabricating the MOS that substantially overcomes drawbacks of above mentioned problems arised from the conventional methods.

Accordingly, it is a main object of the present invention to provide a method for fabricating the metal-oxide-semiconductor. This invention can use plasma doping to substitute for conventional process, so as to avoid damaging gate dielectric layer and decrease the complex of process. Hence, the present invention is appropriate for deep sub-micron technology to provide the semiconductor devices.

Another object of the present invention is to provide a method for forming the gate dielectric layer. The present invention can form a ultra shallow ions-distribution as an ion-barrier layer on the gate dielectric layer by means of a plasma doping process and a thermal process, so as to prevent the ions penetration effect and protect threshold voltage. Accordingly, this invention can provide a metal-oxide-semiconductor device whose performance is better than the conventional one to increase yield and quality of the process and, hence, decrease cost. Therefore, the present invention can correspond to economic effect.

Still another object of the present invention is to provide a method for forming the gate. The present invention can make nitrogen onto the surface of the gate oxide layer by way of a pulsed plasma doped process and a thermal process, so as to obtain a shallow distribution of dosage and form a poly-gate having a concentration distribution of silicon nitride ($Si_xN_y$). Hence, this invention can avoid boron ions into substrate during the thermal process to protect the channel characteristic of the device.

In accordance with the present invention, a new method for forming semiconductor devices is disclosed. First of all, a semiconductor substrate is provided. Then a gate oxide layer having an uniform thickness is formed on the semiconductor substrate by way of using thermal oxidation. Subsequently, a doping layer is formed on the gate oxide layer by a plasma doped process. Next, forming a poly-layer on the doping layer of the gate oxide layer, wherein the poly-layer has an ions-distribution. Afterward, defining the poly-layer to form a poly-gate. The P-type ions are then implanted into the poly-gate and the substrate by way of using a self-aligned process. Finally, performing a thermal annealing process to form a uniform ion-implanting region and a poly-gate having a lower contact-resistance.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
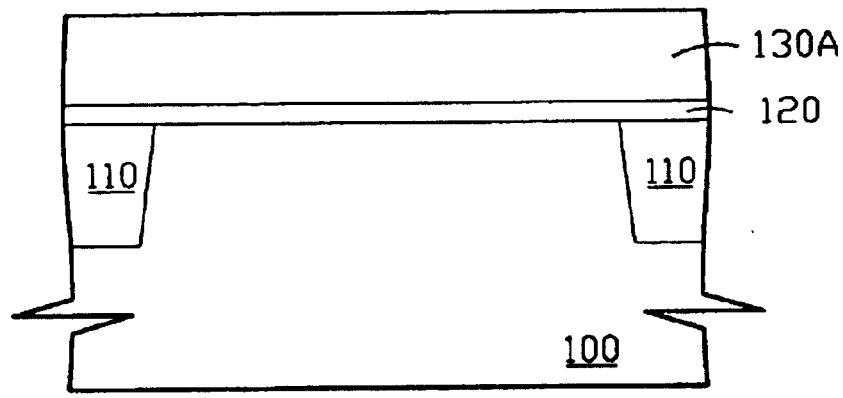
FIG. 1A to FIG. 1C show cross-sectional views illustrative of the metal-oxide-semiconductor by way of using the conventional process.
Figure 1B:
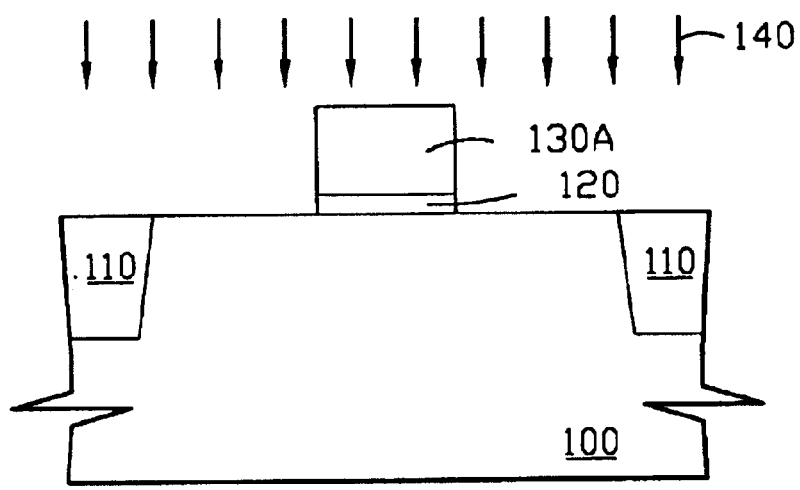
Figure 1C:
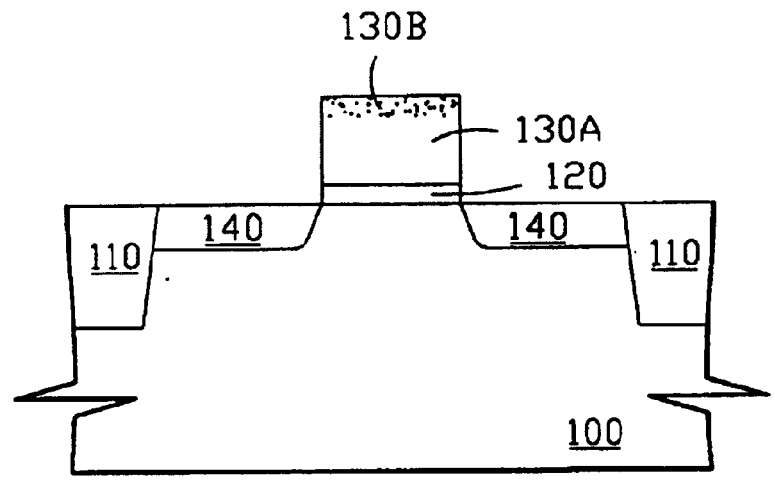
Figure 2A:
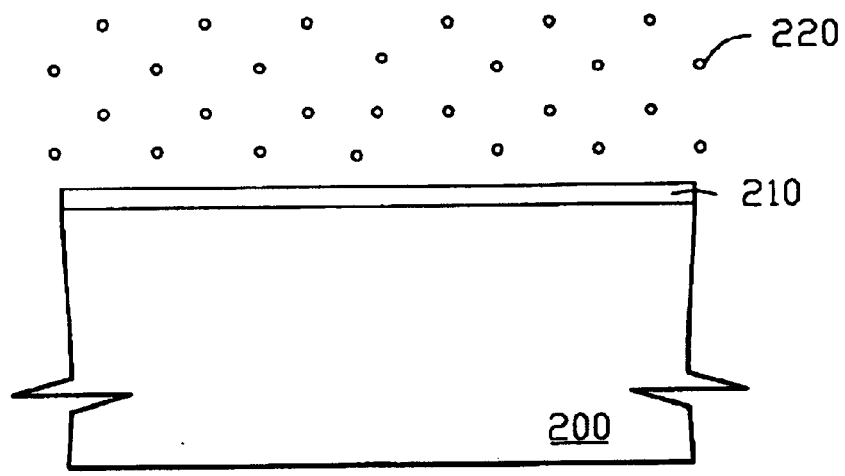
FIG. 2A and FIG. 2B show cross-sectional views illustrative of various stages for forming a dielectric layer in accordance with the first embodiment of the present invention.
Figure 2B:
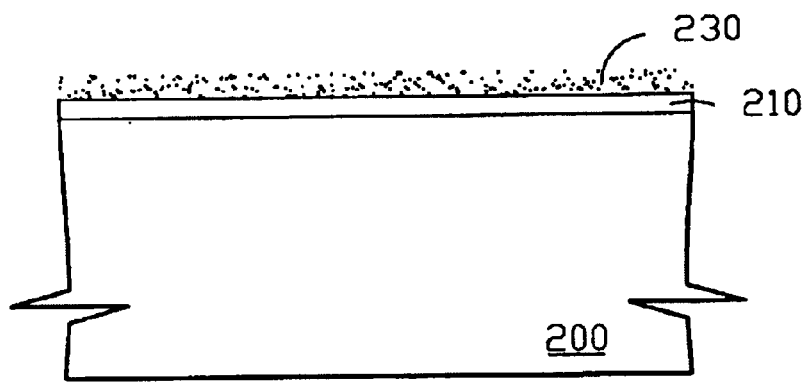

As illustrated in FIG. 2A, in the first embodiment of the present invention, first of all, a semiconductor substrate 200 is provided. Then a dielectric layer 210 is formed on the semiconductor substrate 200, wherein the method for forming the dielectric layer 210 comprises a thermal process, such as a thermal oxide process. Afterward, a dosage 220 is absorbed on the dielectric layer 210 by way of using a plasma doped process to form a doped layer 230 on the dielectric layer 210, wherein the dosage 220 comprises nitrogen, as shown in FIG. 2B.

Figure 3A:
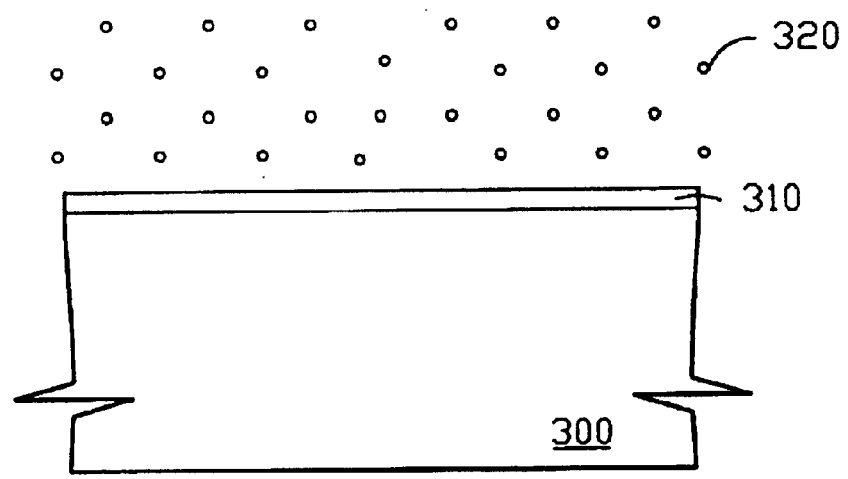
FIG. 3A to FIG. 3E show cross-sectional views illustrative of various stages for forming a metal-oxide-semiconductor device in accordance with the second embodiment of the present invention.
Figure 3B:
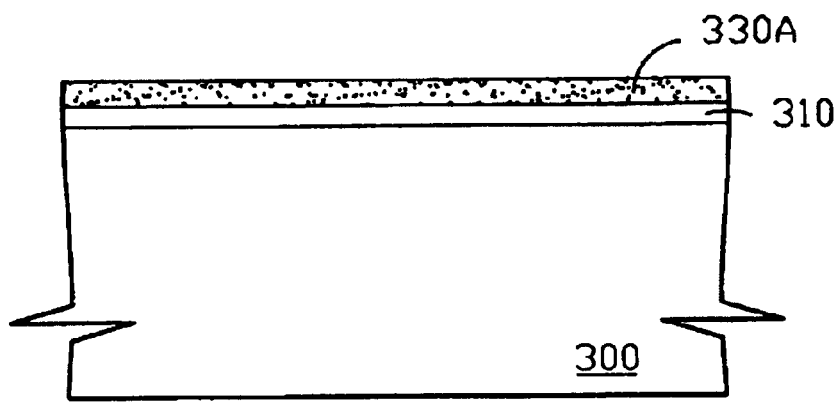

As illustrated in FIG. 3A, in the second embodiment of the present invention, first of all, a semiconductor substrate 300, such as a silicon substrate, is provided. Then a gate dielectric layer 310, such as an oxide layer, are formed on the semiconductor substrate 300. Afterward, a reacted gas 320, such as nitrogen, is absorbed on the gate dielectric layer 310 by way of using a plasma doped process, such as a pulsed plasma doped process to form a doped layer 330A, wherein the plasma doped process can separate the reacted gas 320 to form the plasma ions and make the plasma ions to absorbed on the doped layer 330A, as shown in FIG. 3B.

Figure 3C:
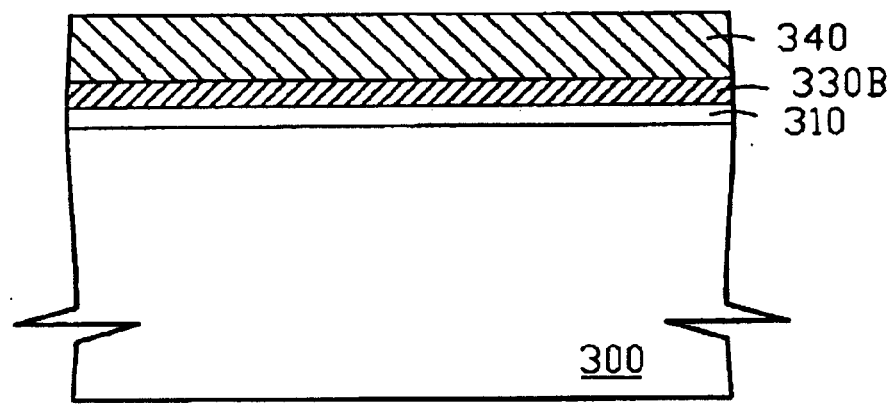
Figure 3D:
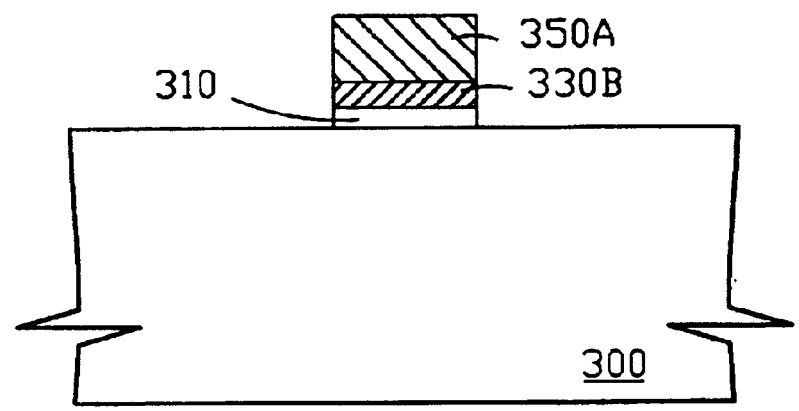
Figure 3E:
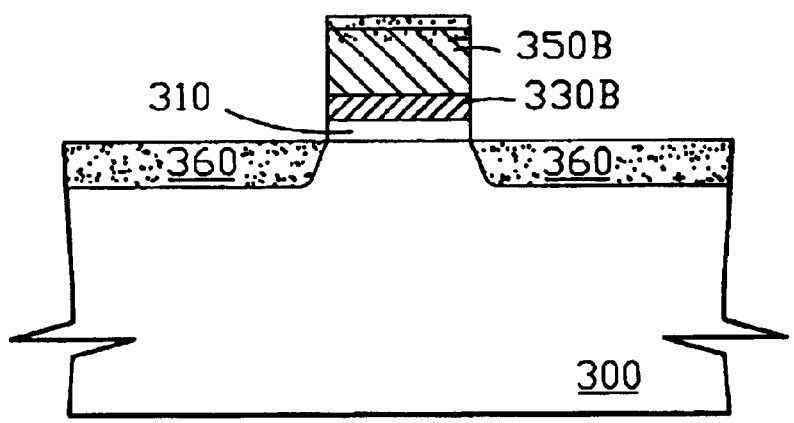

As illustrated in FIG. 3C to FIG. 3E, in this embodiment, proceeding a thermal process, such as a rapid thermal process (RTP) to form an ion-barrier layer 330B from doped layer 330A. Then a conductor layer 340A is formed on the ion-barrier layer 330B. Afterward, defining the conductor layer 340A to form a gate 350A. Next, the ions are implanted into the gate 350A and the substrate 300 by way of using a self-aligned process. Finally, performing a thermal annealing process to form an ion-doping region 360 in the substrate 300 and a gate 350B having a lower contact-resistance.

Figure 4A:
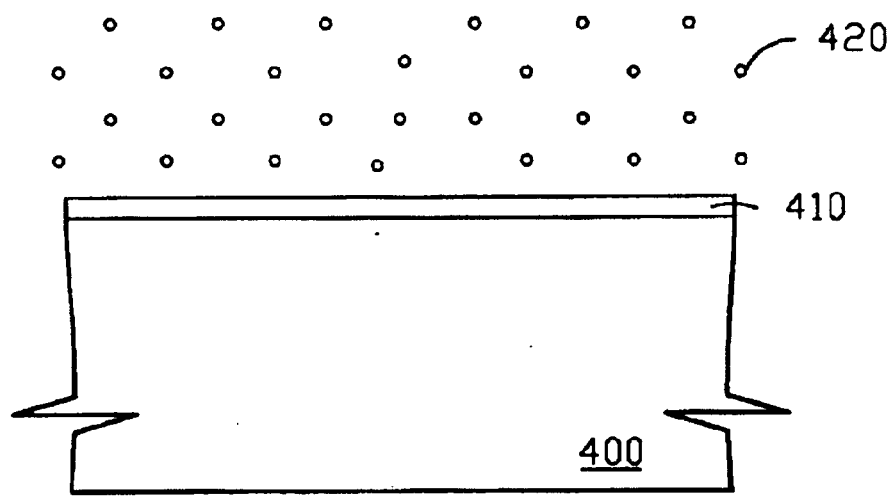
FIG. 4A to FIG. 4D show cross-sectional views illustrative of various stages for forming a metal-oxide-semiconductor device having salicide in accordance with the third embodiment of the present invention.
Figure 4B:
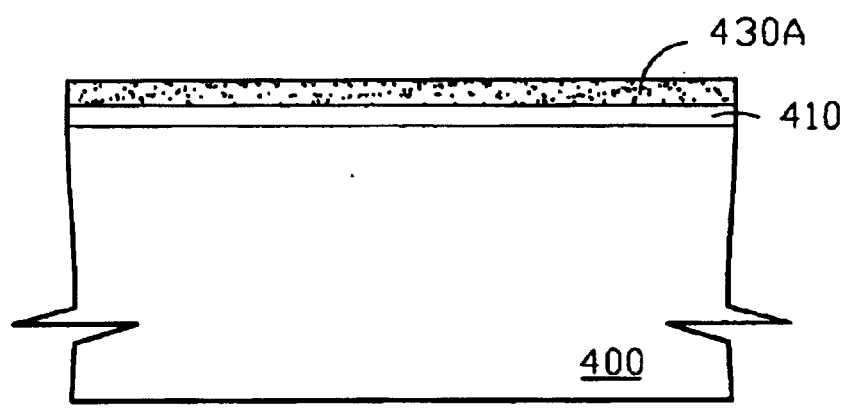

As illustrated in FIG. 4A, in the third embodiment of the present invention, first of all, a semiconductor substrate 400, such as a silicon substrate, is provided. Then a gate dielectric layer 410, such as an oxide layer, is formed on the semiconductor substrate 400. Afterward, a reacted gas 420, such as nitrogen, is absorbed on the gate dielectric layer 410 by way of using a plasma doped process, such as a pulsed plasma doped process to form a doped layer 430A on the gate dielectric layer 410, wherein the plasma doped process can separate the reacted gas 420 to form the plasma ions and make the plasma ions to absorbed on the doped layer 430A, as shown in FIG. 4B.

Figure 4C:
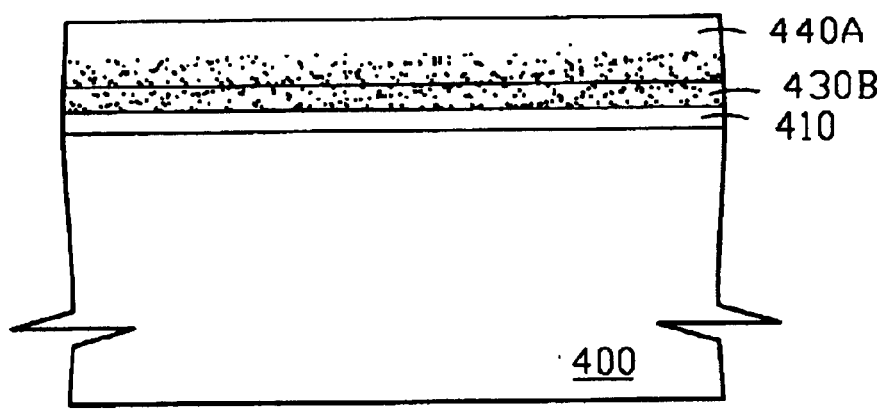
Figure 4D:
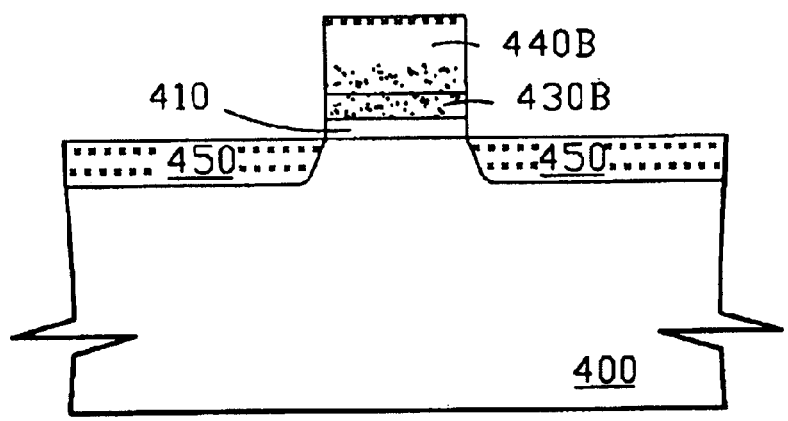

As illustrated in FIG. 4C, in this embodiment, a conductor layer 440A is formed on the doped layer 430A, wherein the plasma ions of the doped layer 430A can react with the conductor layer 440A during the growth of the conductor layer 440A, so as to form an ions-distribution as an ion-barrier layer 430B in the conductor layer 440A. Afterward, defining the conductor layer 440A to form a gate 440B. Next, the ions are implanted into the gate 440B and the substrate 400 by way of using a self-aligned process. Finally, performing a thermal annealing process to form an ion-doping region 450 in the substrate 400 and a gate 440B having a lower contact-resistance, as shown in FIG. 4D.

Figure 5A:
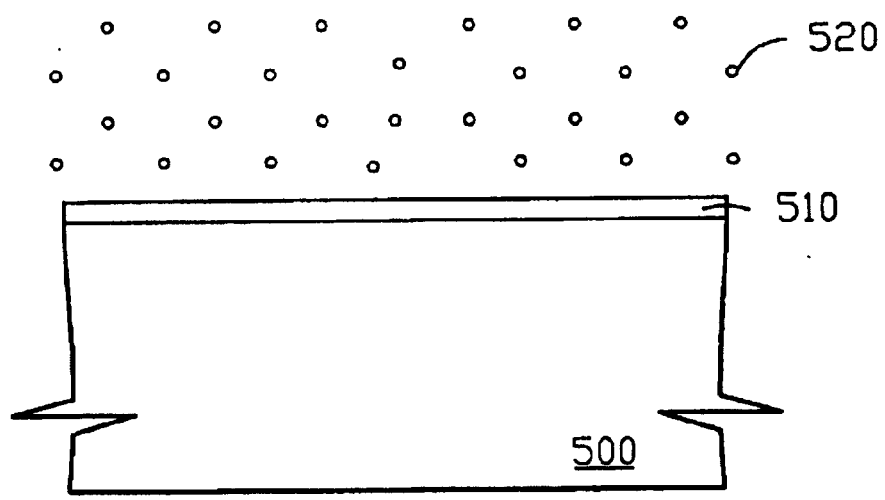
FIG. 5A to FIG. 5C show cross-sectional views illustrative of various stages for forming a metal-oxide-semiconductor device having salicide in accordance with the fourth embodiment of the present invention.
Figure 5B:
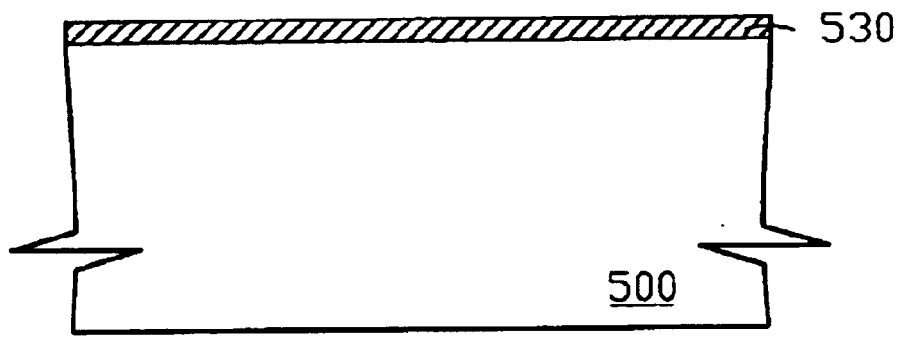

As illustrated in FIG. 5A, in the fourth embodiment of the present invention, first of all, a silicon substrate 500 is provided. Then a gate oxide layer 510 is deposited and formed on the silicon substrate 500. Afterward, a nitrogen gas 520 is absorbed on the gate oxide layer 510 by a pulsed plasma doped process having a dosage concentration that is about $10^{14}/cm^2$ to $10^{17}/cm^2$, wherein the pulsed plasma doped process comprises an energy that is about 200 eV to 10000 eV. Next, proceeding a rapid thermal process (RTP) to form a nitride oxide layer 530, such as SiON, wherein the temperature of the rapid thermal process (RTP) is about 800° C. to 1000° C., as shown in FIG. 5B.

Figure 5C:
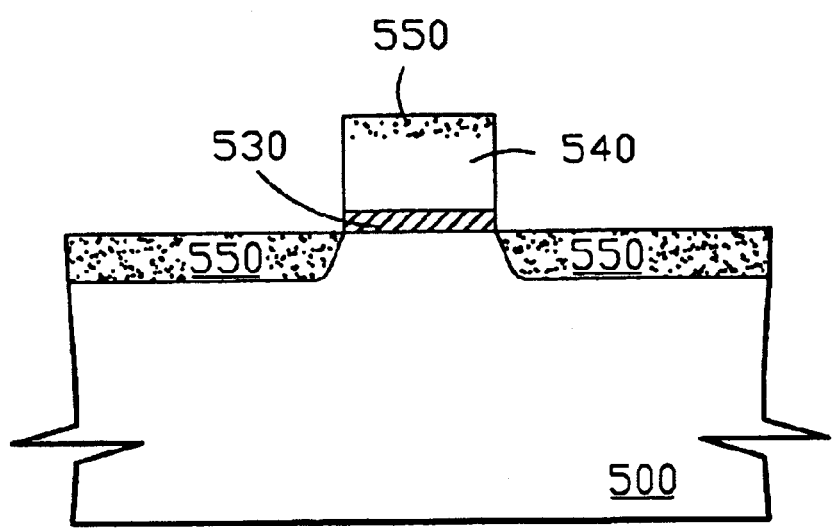

As illustrated in FIG. 5C, in this embodiment, a poly-layer is formed on the nitride oxide layer 530. Afterward, defining the poly-layer to form a poly-gate 540. Next, the P-type ions, such as boron ions, are implanted into the poly-gate 540 and the substrate 500 by way of using a self-aligned process. Finally, performing a thermal annealing process to form a P-type ion-doping region 550 in the substrate 500 and a poly-gate 540 having a lower contact-resistance.

Figure 6A:
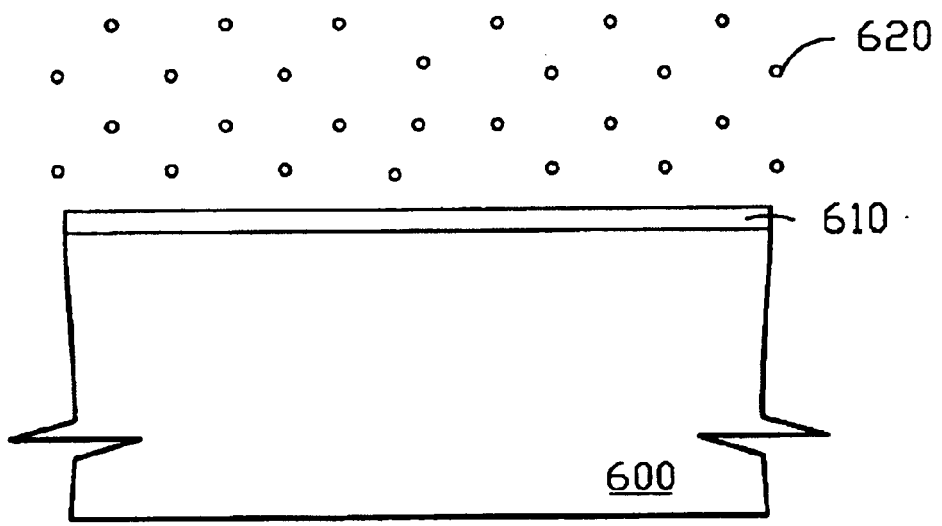
FIG. 6A to FIG. 6D show cross-sectional views illustrative of various stages for forming a metal-oxide-semiconductor device having salicide in accordance with the fifth embodiment of the present invention.
Figure 6B:
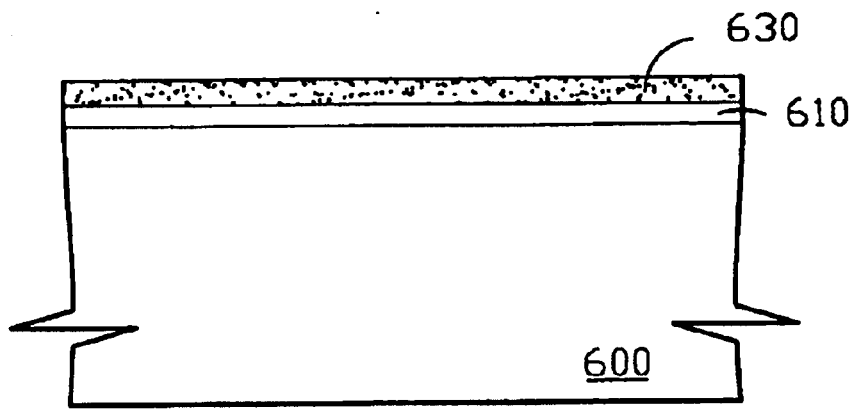

As illustrated in FIG. 6A, in the fifth embodiment of the present invention, first of all, a silicon substrate 600 is provided. Then a gate oxide layer 610 is formed on the silicon substrate 600. Afterward, an nitrogen gas 620 is absorbed on the gate oxide layer 610 by a pulsed plasma doped process having a dosage concentration that is about $10^{14}/cm^2$ to $10^{17}/cm^2$, so as to form an absorbed layer, wherein the pulsed plasma doped process comprises an energy that is about 200 eV to 10000 eV, as shown in FIG. 6B.

Figure 6C:
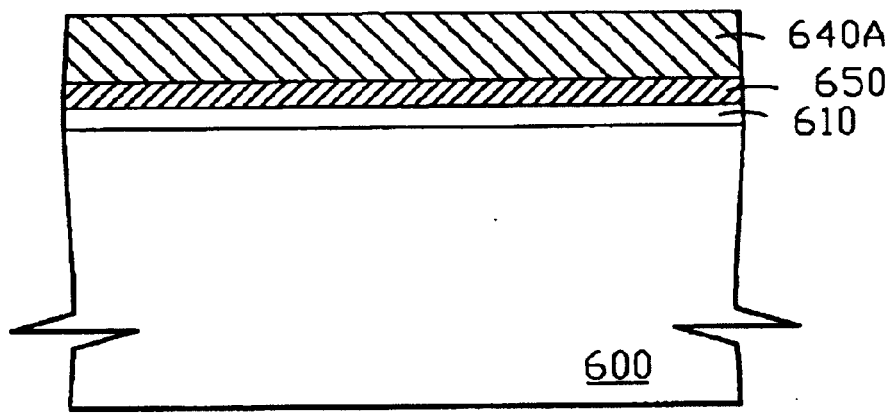
Figure 6D:
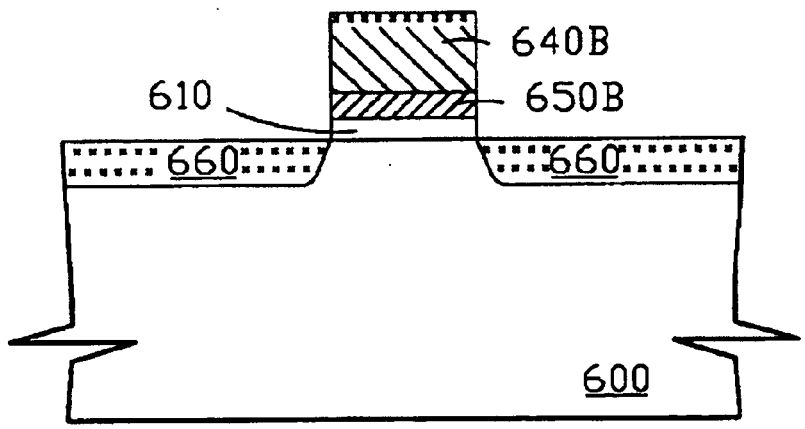

As illustrated in FIG. 6C, in this embodiment, a poly-layer 640A is formed on the absorbed layer 630, wherein the nitrogen ions in the absorbed layer 630 can react with the poly-layer 640A during the growth of the poly-layer 640A, so as to form an ions-distribution as an ion-barrier layer 650 in the poly-layer 640A, and that the ion-barrier layer 650 comprises $Si_xN_y$. Afterward, defining the poly-layer 640A to form a poly-gate 640B. Next, the boron ions are implanted into the poly-gate 640B and the substrate 600 by way of using a self-aligned process. Finally, performing a thermal annealing process to form a boron ion-doping region 660 in the substrate 600 and a poly-gate 640B having a lower contact-resistance, as shown in FIG. 6D.

In these embodiments of the present invention, as discussed above, the present invention provide a method for preventing ion-penetration effect. This invention can use the plasma doping process to substitute for conventional process, so as to avoid damaging the gate dielectric layer, and that can simplify complex process. Hence, the present invention is appropriate for deep sub-micron technology to provide the semiconductor devices. Furthermore, The present invention can form an ultra shallow ions-distribution as an ion-barrier layer on the gate dielectric layer by means of a plasma doping process and a thermal process, so as to prevent the ions penetration effect and protect threshold voltage. Accordingly, this invention can provide a metal-oxide-semiconductor device whose performance is better than the conventional one to increase yield and quality of the process and, hence, decrease cost. Therefore, the present invention can correspond to economic effect. The present invention can make nitrogen onto the surface of the gate oxide layer by way of a pulsed plasma doped process and a thermal process, so as to obtain a shallow distribution of dosage and form a poly-gate having a concentration distribution of silicon nitride($Si_xN_y$). Hence, this invention can avoid boron ions into substrate during the thermal process to protect the channel characteristic of the device.

Moreover, the plasma doping process directly uses the plasma ions that flow into the reaction chamber to react, whereby forming a reacted boundary layer on the surface of the substrate, and the boundary layer will be changed in according with the variation of the concentration. On the contrary, the concept for pulsed plasma doping is using the gas flow into the reaction chamber with intermittent voltage method that is controlled by add/none voltage, so as to separate positive ions from the gas, and then the positive ions move forward to the substrate surface so that the boundary layer is uniform and steady-state. Accordingly, the driving force can be controlled to keep constant. Therefore, the present invention can obtain a shallow dosage profile by way of the pulse plasma doping that is the pulse plasma doping can drive the nitrogen to close to the surface of the substrate, so as to avoid affecting the channel of the devices. Hence, this method can also reduce the destructiveness of the substrate so that the damage is easy to be repaired during the thermal oxidation process, and that acquire an interface between silicon and silicon oxide in the integrity.

Of course, it is possible to apply the present invention to the process for forming the dielectric layer, and also it is possible to the present invention to any one metal-oxide-semiconductor in the semiconductor devices. Also, this invention can be applied to use pulsed plasma doping concerning the metal-oxide-semiconductor process used for forming dielectric layer has not been developed at present. Method of the present invention is the best metal-oxide-semiconductor compatible process for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a gate, said method comprising:

providing a substrate;

forming a dielectric layer on said substrate;

performing a plasma doping process to form an absorbed layer on said dielectric layer;

forming a first conductor layer to react with said absorbed layer, so as to form a second conductor layer having an absorbed-ions distribution on said dielectric layer; and forming and defining said second conductor layer to form a gate having said absorbed-ions distribution on said dielectric layer.

2. The method according to claim 1, wherein said plasma doping process comprises a pulsed plasma doping process.

3. The method according to claim 1, wherein said absorbed layer comprises nitrogen.

4. A method for forming a gate, said method comprising:

providing a silicon substrate;

forming an oxide layer on said silicon substrate;

performing a pulsed plasma doping process to form an nitrogen-absorbed layer on said oxide layer;

forming a first conductor layer to react with said nitrogen-absorbed layer, so as to form a second conductor layer having an ions-absorbed distribution on said oxide layer;

defining said second conductor layer to form a gate having said ions-absorbed distribution on said oxide layer; and forming an ion-doping region in said gate and an ion-doping region in said silicon substrate by way of using an implanting process.

5. The method according to claim 4, wherein the energy of said pulsed plasma doping process is about 200 eV to 10000 eV.

6. The method according to claim 4, wherein the dosage of said nitrogen is about $10^{14}/cm^2$ to $10^{17}/cm^2$.

7. The method according to claim 4, wherein said nitrogen-absorbed layer comprises silicon nitride.

8. The method according to claim 4, wherein said implanting process comprises a self-aligned implanting process.

9. The method according to claim 4, wherein the step for forming said ion-doping region comprises a thermal annealing process.

10. The method according to claim 4, wherein said ion-doping region comprises P-type ions.

11. The method according to claim 10, wherein said P-type ions comprises boron ions.

* * * * *